(12) United States Patent
Evans et al.

(10) Patent No.: US 6,879,509 B2
(45) Date of Patent: Apr. 12, 2005

(54) READ-ONLY MEMORY ARCHITECTURE

(75) Inventors: Donald A. Evans, Lancaster, OH (US);
Ross Alan Kohler, Allentown, PA (US); Nghia Q. Lam, Allentown, PA (US); Richard Joseph McPartland, Nazareth, PA (US); Hai Quang Pham, Hatfield, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/442,832

(22) Filed: May 21, 2003

(65) Prior Publication Data

US 2004/0233693 A1 Nov. 25, 2004

(51) Int. Cl.[7] .............................................. G11C 17/00
(52) U.S. Cl. ........................ 365/104; 365/94; 365/177
(58) Field of Search ......................... 365/104, 94, 177, 365/205, 203

(56) References Cited

U.S. PATENT DOCUMENTS 4,064,493 A * 12/1977 Davis ........................... 365/96
5,027,319 A * 6/1991 Lai ............................. 365/156
5,757,690 A * 5/1998 McMahon ................... 365/104

* cited by examiner

Primary Examiner—David Lam
(74) Attorney, Agent, or Firm—Nancy R. Gamburd

(57) ABSTRACT

The present invention provides a read-only memory (ROM) architecture. An exemplary ROM array includes a plurality of columns, a plurality of rows, a first plurality of transistors or other switches representing a "0" data state or low voltage state, and a second plurality of transistors or other switches representing a "1" data state or high voltage state. Each transistor has a corresponding drain coupled to a column and a gate coupled to a row. Each transistor of the first plurality has a source coupled to a source voltage bus, and each transistor of the second plurality has a source not coupled to the source voltage bus, through use of a programmable contact window during fabrication. In various embodiments, for a selected column, drains of pair-wise adjacent transistors share a common drain-column contact and common diffusion region.

67 Claims, 5 Drawing Sheets

READ-ONLY MEMORY ARCHITECTURE

FIELD OF THE INVENTION

The present invention relates, in general, to integrated circuits having data storage capability and, in particular, to read-only-memory architectures.

BACKGROUND OF THE INVENTION

Non-volatile semiconductor data storage devices, such as read only memories ("ROMs"), are designed to store data in a ROM array of memory "cells". Each memory cell, consisting of a single transistor per bit of storage, is hardware preprogrammed during the integrated circuit ("IC") fabrication process and is capable of maintaining the stored data indefinitely, even in the absence of power. ROM memories may be included in any type of IC, such as an IC that substantially contains only ROM memory, as a dedicated ROM IC, or included as an "embedded" memory as part of an IC containing additional, other substantial circuits, such as embedded ROM memory with a processor, digital signal processor, controller, wireless telecommunication or other communication IC. In general, ROM memory is used to hold and make available data or code that will not be altered after IC manufacture. Data or code is programmed into ROM memory during fabrication.

A ROM array of memory cells is defined by a number of transistors generally arranged in a grid pattern having a plurality (or series) of rows and columns. Each individual transistor of each memory cell of the ROM array is placed between a column of the series of columns and a voltage bus. The column is supplied with power at a first predetermined voltage level, referred to as the "pre-charged voltage level", "$V_{PC}$", and the voltage bus is supplied with power at a second, different predetermined voltage level. For the sake of clarity, this voltage bus will be referred to as the "source voltage bus", which has the second predetermined voltage level; the source voltage bus with its second predetermined voltage level will be referred to as "Vsvb". Common values for these first and second predetermined voltage levels typically depend upon the selected ROM implementation. For example, when the transistors of the array are n-channel, the column is typically pre-charged to a first predetermined voltage level ($V_{PC}$) substantially equal to a power supply voltage ("Vdd") or another selected pre-charged voltage level, while the second predetermined voltage level (Vsvb) is ground or zero volts. Vsvb, however, could have other non-zero values. For example, when the transistors of the array are p-channel, the column is typically pre-charged to the first predetermined voltage level ($V_{PC}$) substantially equal to a ground potential, zero volts or another selected pre-charged voltage level, while the second predetermined voltage level (Vsvb) is substantially equal to a power supply voltage ("Vdd") or another selected pre-charged voltage level.

A gate of each transistor of a ROM array is connected to a particular row of the series of rows. In the prior art, a source of each transistor is always connected to the source voltage bus, and a drain of each transistor is or is not connected to a particular column of the series of columns, depending upon how the cell is to be programmed. The ROM array is programmed during fabrication by the presence or absence of such a drain-to-column connection (a drain-to-column "contact window"). As indicated above, each column of the series of columns is typically pre-charged to a first predetermined voltage potential referred to as the "pre-charged voltage level", $V_{PC}$. This voltage level is different than that of the source voltage bus, Vsvb. Typically, $V_{PC}$ may be a voltage higher than ground or higher than 0 volts (a positive or high voltage). The column residing at the pre-charge voltage represents a first logical state such referred to as a "1" data state or a first data state, and is subject to operation of its associated transistor(s).

In the prior art, the memory cells of a ROM array are preprogrammed via the presence or absence of a contact window between their transistor drains and their corresponding columns, while all sources are coupled to the source voltage bus. All columns are pre-charged to the pre-charged voltage level $V_{PC}$. When a "1" data state is desired for a particular bit stored on a particular transistor, no contact is made between that transistor drain and its corresponding column (i.e., absence of the contact window). As a consequence, the column continues to maintain its pre-charged voltage when a row connected to that transistor gate (i.e., a corresponding row) is activated, given the absence of a drain contact to the column. In contrast, when a second logical state referred to as a "0" data state or a second data state is desired for the particular bit stored on a particular transistor, given that its drain is coupled to its corresponding column via the contact window, when the row connected to that transistor gate (i.e., a corresponding row) is activated and the transistor conducts, that column voltage is moved or pulled to the potential of the source voltage bus, Vsvb. That column, therefore, does not maintain its pre-charged voltage level associated with the logical high or first data state, but now represents a logical low or second data state.

To obtain information from a ROM, by a "Read" operation, a row is activated. All transistors along that row are activated via their respective gates. Along the activated row, all of the transistors that have been programmed to a "0" data state move their respective columns towards Vsvb potential. All transistors that have been programmed to a "1" data state will not change the voltage of their associated columns. Their column voltages remain at $V_{PC}$. The different voltage levels, $V_{PC}$ and Vsvb, are sensed from selected columns, such as for a byte or word of information, using sense amplifiers. Even though all of the columns along a row are activated, only some of the columns are "selected" for output; that is, their data represented by their corresponding voltage levels are forwarded to the output of the memory. The selected columns are typically arranged in a periodic order throughout the population of columns (e.g., reading from every eighth column). A particular data word is selected through appropriately addressing a selected row and selected columns.

With increasing cell density and decreasing feature size, adjacent columns may interact, potentially resulting in read errors. For example, as feature sizes may be reduced using a 0.16 micron or smaller fabrication technology, errors may result from an interaction between a selected column and its adjacent or nearby columns due to capacitive coupling. Such undesirable capacitive coupling between a selected column and its neighboring columns may cause increased memory "read faults".

In order to simplify the following description, $V_{PC}$ will be assumed to be a positive or high voltage level and Vsvb will be assumed to be ground voltage potential. Capacitive coupling read faults can occur when a column, associated with reading a "1" data state programmed cell, is activated or "selected", and its neighboring column, associated with reading a "0" data state programmed cell, is pulled to ground. Furthermore, more than one neighboring column may interact in this way with the selected column. Capacitive coupling between the selected column and one or more neighboring columns may cause the voltage level of the selected column to be pulled below its desired, pre-charged positive or high voltage level and appear as a low voltage ("0" data state) rather than a positive or high voltage ("1" data state) to its associated sense amplifier, resulting in a read error for that stored bit. Capacitive coupling between columns can cause the same type of read failures regardless of the operational voltage levels for $V_{PC}$ and Vsvb.

In the prior art, read errors that could occur due to capacitive coupling have been avoided by maintaining relatively large physical separation or spacing between array features such as the array columns, resulting in lower cell densities on an integrated circuit. Such increased distance (or physical separation) between features is not a viable alternative for eliminating read errors when increased density, i.e., less physical separation between array features, is required or desired for a ROM architecture.

As a consequence, a need remains to provide a ROM architecture having a reduced feature size and higher cell density, while simultaneously alleviating any read errors which may arise due to capacitive coupling or other interference between or among array features, such as capacitive coupling between neighboring or adjacent array columns.

SUMMARY OF THE INVENTION

The present invention provides a read-only memory (ROM) architecture. An exemplary ROM array includes a plurality of columns forming a read bus, a plurality of rows forming a word selection bus, a first plurality of transistors representing a logical zero or "0" data state, and a second plurality of transistors representing a logical one or "1" data state. Each transistor of the first plurality of transistors has a corresponding drain coupled to a selected column of the plurality of columns, a gate coupled to a selected row of the plurality of rows, and has a source coupled to a source voltage bus. Each transistor of the second plurality of transistors has a corresponding drain coupled to a selected column of the plurality of columns, has a gate coupled to a selected row of the plurality of rows, and has a source not coupled to or otherwise electrically isolated from the source voltage bus. When operative, the columns are pre-charged to a first predetermined voltage level, $V_{PC}$. The source voltage bus is a power bus that is supplied with power at a different, second predetermined voltage level, Vsvb. Although Vsvb may be other voltages, a typical value is 0 volts or ground potential.

The various source-to-source voltage bus couplings are programmable and are established during fabrication. During operation of an exemplary ROM array, when a transistor of the first plurality of transistors is activated, the transistor conducts and the corresponding, pre-charged column voltage level is changed (charged or discharged) substantially to the second predetermined voltage level, Vsvb. When a transistor of the second plurality of transistors is activated, the transistor does not conduct and the corresponding, pre-charged column remains substantially at the pre-charged voltage level, $V_{PC}$.

In various embodiments, for a selected column of the plurality of columns, corresponding drains of adjacent and paired transistors of the plurality of transistors are coupled to the selected column through a shared, fixed contact.

In another embodiment, the present invention provides an integrated circuit including a read-only memory. The integrated circuit includes a column adapted to be driven to a first potential; a row; and a switch device controlled by the row and providing a current path from the column on a first side of the switch device to a second potential on a second side of the switch device, the second potential different than the first potential, and the current path capable of being completed or not completed through a first programmable connection on the second side of the switch device. Depending upon the selected embodiment, the second potential is lower than the first potential, the second potential is a ground potential, or the second potential is higher than the first potential. The switch device may be a transistor, such as a metal oxide semiconductor transistor or a bipolar junction transistor. Again, the capability of the current path being completed or not completed through the first programmable connection is predetermined during fabrication of the integrated circuit.

Another embodiment of the invention provides a method of fabricating a cell for a read-only memory of an integrated circuit. The method includes providing a column; providing a row; providing a switch device controlled by the row; providing an electrical connection between the column and a first side of the switch device; for a first data state, providing an electrical connection between a second side of the switch device and a voltage bus; and for a second data state, not providing an electrical connection between the second side of the switch device and the voltage bus. The step of providing an electrical connection between the second side of the switch device and the voltage bus and the step of not providing an electrical connection between the second side of the switch device and the voltage bus further comprise determining a corresponding state of a programmable contact window between the second side of the switch device and the voltage bus. The step of providing a switch device may include fabricating a transistor, such as fabricating a metal oxide semiconductor transistor having: a drain coupled to the column; a gate coupled to the row; for the first data state, having a source coupled to the voltage bus through a programmable contact window, and for the second data state, having a source not coupled to the voltage bus through the programmable contact window. Alternatively, the step of fabricating a transistor may include fabricating a bipolar junction transistor having: a collector coupled to the column; a base coupled to the row; for the first data state, having an emitter coupled to the voltage bus through a programmable contact window, and for the second data state, having an emitter not coupled to the voltage bus through the programmable contact window.

Among other advantages, the various embodiments of the ROM array provide for reduced capacitive coupling and a corresponding reduction in read errors.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, in which.

DETAILED DESCRIPTION OF THE EXEMPLARY EMBODIMENTS

Figure 1:
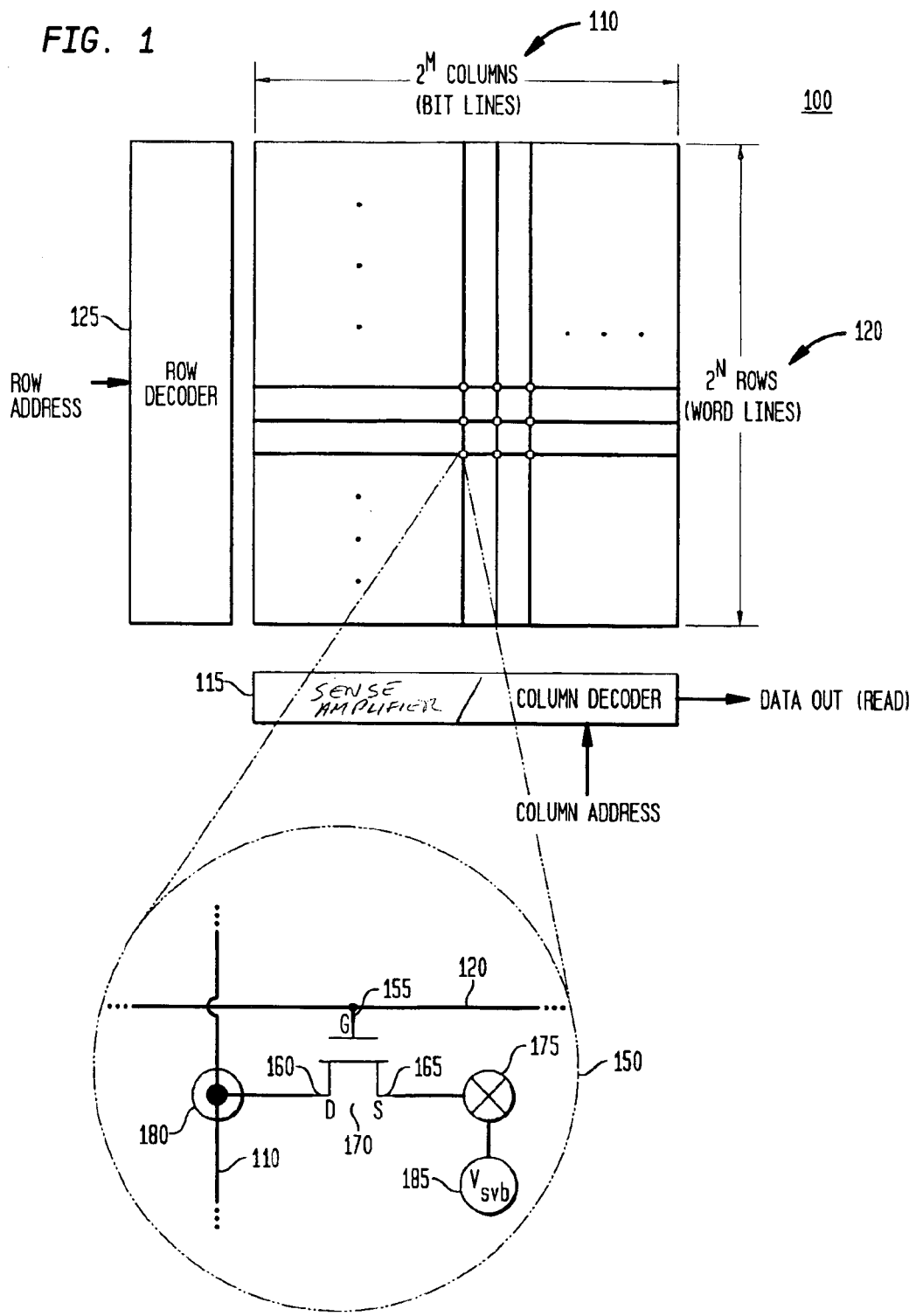
FIG. 1 (or FIG. 1) is a circuit and block diagram of an exemplary ROM array using a ROM cell in accordance with the teachings of the present invention.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As mentioned above, a need remains to provide a ROM architecture having a reduced feature size and higher cell density, such as that available using a 0.16 micron (or smaller) fabrication technology, while simultaneously alleviating read errors which may arise due to capacitive coupling or other interference between or among array features, such as capacitive coupling between neighboring or adjacent array columns. The present invention provides such a ROM architecture.

The various embodiments of the read-only memory of the present invention are, for purposes of explanation and not limitation, illustrated using metal oxide semiconductor field effect transistors (MOSFETs). It should be understood that the various embodiments of the ROM of the present invention may be implemented using any type of suitable switching device, such as any form or type of transistor, of any configuration, and may be implemented using other types of switching devices which are or may not be currently available or presently known.

As used herein, and in some examples, column pre-charge potential, $V_{PC}$, is assumed to be a positive voltage potential, such as a power supply voltage level (Vdd) or another selected voltage level, while the potential of the source voltage bus, Vsvb, is assumed to be ground potential (0 volts). It should be understood and recognized that these potentials, $V_{PC}$ and Vsvb, could be any two non-identical potentials, and any such first and second potentials are within the scope of the present invention. The IC semiconductor substrate at times is assumed to be at ground potential (0 volts), although it is recognized that it could be at other potentials. All such variations are considered equivalent and are within the scope of the present invention.

Also as used herein, the assignments of a first logical state and a second logical state, a first data state and a second data state, or a "0" data state and "1" data state, and corresponding voltage levels, are arbitrary, and all such assignments are within the scope of the present invention. For example, while a "1" data state may be assigned arbitrarily to be associated with a column retaining its pre-charged $V_{PC}$ voltage value, and while a "0" data state may be assigned arbitrarily to be associated with a column changing its initial pre-charged $V_{PC}$ voltage value to the source voltage bus value, Vsvb, it should also be understood that the logical or data state assignment could have been reversed or interchanged. More generally, first and second logical states or first and second data states may simply be assigned as may be convenient, with no further limitation to be implied or inferred, such as whether each corresponds to a comparatively higher or lower voltage. In addition, as indicated above, such voltage states also may vary depending upon the selected embodiment, such as using n-channel or p-channel transistors or other switches. Again, all such variations are considered equivalent and are within the scope of the present invention.

As mentioned above, capacitive coupling from neighboring or adjacent cell features, such as adjacent or neighboring array columns, is of increasing significance with smaller feature sizes and higher cell densities. In the prior art, such column to column coupling may be due to several sources.

The drain-to-column contact window of the prior art is one such source of capacitive coupling. It forms a vertical, tubular conductive connection between the column and the drain. Such a contact window, as a vertical, tubular conductive connection, has a horizontal capacitive coupling to other such contact windows on neighboring columns and a fringing capacitive coupling to neighboring columns. In the prior art, the undesirable, column-to-column, drain-to-column contact window capacitance between any selected column and neighboring columns varies depending upon the number of memory cells programmed to store 0 data states on the selected column and on neighboring columns. The higher the number of memory cells programmed to 0 data states, the higher this component of column capacitance to neighboring columns and to ground (substrate), and the greater the tendency for neighboring columns (as "aggressors") to pull selected columns (as "victims") toward ground potential and cause a read error. As will be appreciated by those of ordinary skill in the art, the term "adjacent columns" as used herein includes any capacitively coupled neighboring column(s), and even columns separated from a victim column by other column(s).

The connected cell drain adds diffusion capacitance to the substrate. Because the cell drain diffusions are only connected to columns when they are programmed to 0 data states, this capacitance is also dependent upon cell programmed data states.

There is also column-to-column capacitance between the selected column, as a strip or wire of metal, and adjacent or neighboring columns, as metal wires or strips. This component of column-to-column capacitive coupling is independent of cell programming.

Speed of the ROM architecture also affects the potential for read errors due to capacitive coupling. The faster the high-to-low transition on an aggressor column, the greater the voltage degradation of the victim column. Such faster low-going transitions may occur when the column has a lower capacitance, increasing the chance for a read failure. Conversely, the higher the capacitance of a potential victim column opposes such column-to-column coupling.

Recent manufacturing technologies (e.g., those characterized by line widths of 0.16 $\mu$m or less) have allowed the physical size of integrated circuit features to be reduced and, as applied to ROMs, may enable a reduction in column spacing between adjacent columns of a ROM array. Associated column spacing reductions, however, exacerbate the problem of capacitive coupling in ROM arrays, and for a prior art ROM array, serve to increase the likelihood of memory read faults. The prior art solution of maintaining greater column spacing between adjacent columns, which yields an increase in the physical size of a ROM, is in direct conflict with physical size reductions and the greater densities afforded to ROMs by newer fabrication technologies.

FIG. 1 is a circuit and block diagram of an exemplary ROM array 100 using a ROM cell 150 in accordance with the present invention. As illustrated, the array is defined using $2^M$ columns (110), as bit lines, and $2^N$ rows (120), as word lines. Any given bit may be randomly accessed for a read operation by inputting the coordinates (i.e., address) of that bit in the array 100. Generally, however, an entire word of data is read by activating a row 120, and reading out the corresponding bits of selected columns 110.

To read one bit of data stored in the ROM memory cell array 100, a row address is input to, and decoded by a row decoder (125) to select one of the rows 120. All of the memory cells 150 along this row are activated. A column decoder 115 then addresses one or more columns out of the $2^M$ columns. Those activated cells 150 affect (move towards Vsvb) or do not affect (remain substantially at the pre-charged level, $V_{pc}$) the associated columns 110. Corresponding high and low column voltages (depending upon the programming) are detected by a sense amplifier (illustrated with column decoder 115), and the corresponding data is then outputted from the ROM memory cell array 100.

For an array of $2^N$ rows and $2^M$ columns containing $2^N \times 2^M$ cells, only one row is activated during a read cycle. Typically, however, more than one column will be selected during a read cycle. The number of columns selected is usually equal to the number of bits in the output word. For example, if the output word width of the ROM array is 32 bits, 32 columns out of the $2^M$ columns are selected. In general, these selected columns are not adjacent to each other, but are evenly spaced in a periodic fashion across the total $2^M$ columns. For example, if there are 128 ($2^7$) columns and 32 outputs, there will be four interleaved groups of 32 columns. The column group to be output will be selected by corresponding column address bits.

FIG. 1 illustrates an exemplary ROM cell 150 for every row and column "intersection" or "crossing". The gate 155 of the transistor 170 is coupled to a row 120, providing for activating the transistor 170 when that row 120 is selected. A marked departure from the prior art, the drain 160 of each transistor 170 is always coupled (connection 180) to the column 110 for all ROM cells 150 of the ROM array 100, i.e., the drain 160 of each transistor 170 comprising the ROM cell 150, for all cells of the array, is always fixed, attached or coupled, non-programmably or non-selectively, to a corresponding column 110. In one of the embodiments discussed in greater detail below, drains 160 of adjacent transistors 170 of the same column may use a shared connection to the column 110, reducing the number of vertical, tubular conductive connections by one-half, with a corresponding reduction in capacitance and capacitive coupling. The shared drain-to-column connection is not limited to two drains, and could be more, depending upon the selected embodiment and IC layout.

Programmability of a ROM cell 150 within the ROM array 100, in accordance with the present invention, is provided through use of a programmable contact window 175 between a source 165 and the source voltage bus 185. The ROM cell 150 is programmed during IC fabrication by coupling or not coupling the source 165 of the transistor 170 to the source voltage bus 185 at voltage potential Vsvb, by providing or not providing a contact window 175. When the contact window 175 is provided and fabricated, it is also known in the field as a "via". When programmed to a "0" data state, the contact 175 is provided between the source 165 and the source voltage bus 185. To subsequently read this programmed data state (0), row 120 is selected, activating gate 155; transistor 170 then conducts, changing the potential on column 110 from the first predetermined voltage level to substantially the second predetermined voltage level, Vsvb. This column 110 potential is detected by the sense amplifier as a "0" data state. To program a "1" data state, the source 165 is not coupled to the source voltage bus 185 by not providing contact window 175. When subsequently reading this data state (1), row 120 is selected, thereby activating gate 155. As the source 165 is not coupled to the source voltage bus 185, transistor 170 does not conduct and the column 110 remains substantially at its pre-charged voltage, the first predetermined voltage level ($V_{PC}$). This column 110 potential is detected by the sense amplifier as a "1" data state.

While the transistor 170 is illustrated using a n-type (n-channel) metal oxide semiconductor (MOS) transistor, other types of switches, including other types of transistors, may be used equivalently, such as a p-type (p-channel) MOS transistor, a bipolar junction transistor (npn or pnp), and so on. As a consequence, corresponding transistor feature names are also used equivalently, such as gate and base, source and emitter, and drain and collector. It will be understood by those of skill in the art that all such switch or transistor variations are equivalent and are within the scope of the present invention.

More generally, while illustrated as a MOS field effect transistor, the transistor 170 is more generally and equivalently a switch, switch device or switching device which, depending upon the selected embodiment, may be implemented as a transistor. Such a switch will be understood to have a plurality of terminals, such as a first terminal (drain, collector, or first side of a switch) coupled to a column 110 having a first predetermined voltage level, a second terminal (source, emitter, or second side of a switch) selectively couplable to a voltage bus 185 having a second predetermined voltage level, and a control terminal to activate the switch (gate, base, or switch control element).

As discussed in greater detail below, various embodiments of the present invention significantly reduce capacitive coupling between neighboring columns. A particular advantage of the present invention is that this is accomplished while retaining a typical array layout; so that the ROM array 100 may be used with backwards or retro-compatibility. For example, the ROM array 100 allows the use of existing addressing schemes, so that existing programs, applications, and other code do not need modification to utilize the present invention.

The various ROM memories and ROM arrays of the present invention may be included in any type of IC, such as an IC that substantially contains only ROM memory, as a dedicated or stand-alone ROM IC, or included as an "embedded" memory as part of an IC containing additional, other substantial circuits or functionality. For example, the various ROM memories and ROM arrays of the present invention may be a portion of an IC having other functionality such as, without limitation, a microprocessor, digital signal processor, micro-controller, controller, wireless processor, network processor, wireless telecommunication IC or other IC with communication functionality; as a consequence, for purposes of the present invention, all such ICs which have such additional functionality and which may include the various ROM memories and ROM arrays of the present invention are individually and collectively referred to herein as "processors" or as "a processor".

The present invention may also be considered to include an integrated circuit including a read-only memory, such as a processor. The integrated circuit includes a column 110 adapted to be driven to a first potential (e.g., $V_{PC}$), such as by being pre-charged to the first potential when the IC is operative (powered on and functioning); a row 120; and a switch device (such as a transistor 170) controlled by the row and providing a current path (or electrical connection) from the column 110 on a first side of the switch device (e.g., 160) to a second potential (e.g., Vsvb) on a second side of the switch device (e.g., 165), the second potential different than the first potential, the current path (or electrical connection) capable of being completed or not completed through a first programmable connection 175 on the second side of the switch device. The second potential may be lower than the first potential, may be a ground potential, or may be higher than the first potential. The capability of the current path (or electrical connection) being completed or not completed through the first programmable connection is predetermined during fabrication of the integrated circuit. Such an embodiment is discussed in greater detail with reference to FIG. 4.

The switch device may be a transistor, with a first terminal (e.g., 160) coupled to the column, a second terminal (e.g., 165) selectively coupled to the second potential (e.g., Vsvb) through the first programmable connection 175, and a third terminal (e.g., 155) coupled to the row. When the transistor is a metal oxide semiconductor transistor, the first terminal is a drain, the second terminal is a source, and the third terminal is a gate. When the transistor is a bipolar junction transistor the first terminal is a collector, the second terminal is an emitter, and the third terminal is a base.

Figure 2:
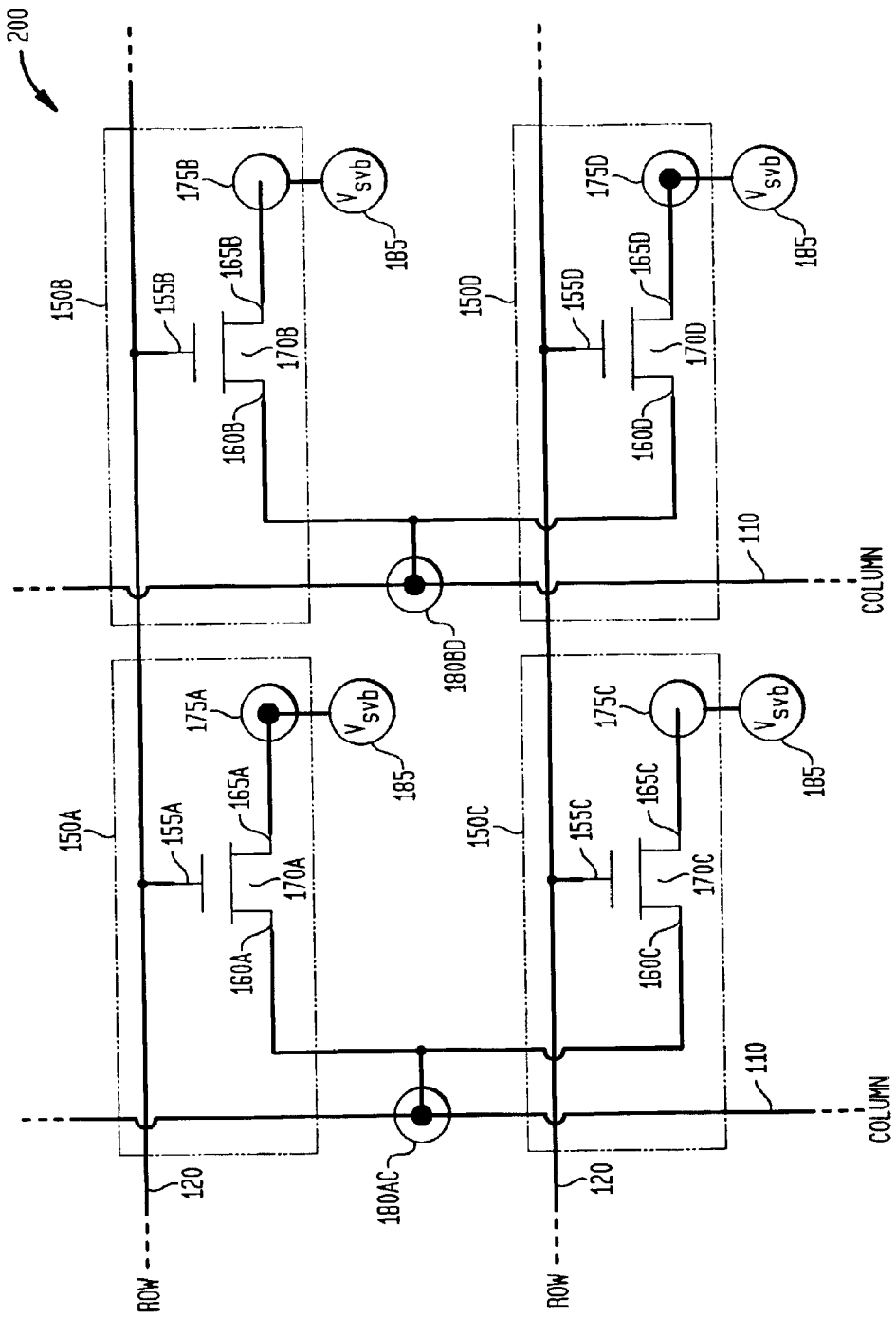
FIG. 2 (or FIG. 2) is a circuit diagram of a first exemplary ROM memory cell array in accordance with the teachings of the invention.

FIG. 2 is a circuit diagram of a portion of a ROM memory cell array 200 in accordance with the present invention. Compared with the prior art ROM memory cell array, the ROM memory cell array 200 not only reduces column-to-column capacitive coupling for any column that has more than one-half of its memory cells programmed to a "0" data state, but also makes column-to-column capacitive coupling completely independent of the number of memory cells programmed to a "0" data state. In addition, ROM array 200 reduces memory read access time by reducing worst-case column capacitance.

As illustrated, the portion of the ROM memory cell array 200 includes four memory cells 150, illustrated as ROM cell 150A, ROM cell 150B, ROM cell 150C, and ROM cell 150D, each of which is correspondingly comprised of a transistor 170, namely, transistor 170A, transistor 170B, transistor 170C, and transistor 170D. The array 200 is defined by the plurality of columns 110 and rows 120, with their corresponding ROM cells 150. As will be appreciated by those of ordinary skill in the art, the ROM memory cell array 200 may include any number of ROM memory cells 150 per column, for example 256 or 512 memory cells per column, and/or any number of rows and columns.

In each ROM cell 150, each gate 155 is coupled to a row 120, and each source 165 is selectively (i.e., programmably) coupled to the source voltage bus 185 (having the second predetermined voltage level), illustrated as Vsvb 185, through a corresponding programmable contact window 175. For purposes of explanation, the ROM array 200 in FIG. 2 is illustrated in a fabricated or programmed state, with the programmable contact windows 175 either having an actual contact (such as a via) connecting a source 165 to the source voltage bus 185 (illustrated in FIG. 2 as a "thick connection dot") to complete an electrical connection (or current path, equivalently) between the source 165 and source voltage bus 185, or having no actual contact (no via) connecting a source 165 to the source voltage bus 185, i.e., no completed electrical connection (no completed current path or equivalently, illustrating electrical isolation) between the source 165 and source voltage bus 185 (illustrated in FIG. 2 without any "thick connection dot"). As illustrated, source 165A has been connected to Vsvb 185 through contact window 175A (as a fabricated via), and source 165D has been connected to Vsvb 185 through contact window 175D (as a fabricated via), thereby programming the corresponding transistors 170A and 170D, of the corresponding ROM cells 150A and 150D, to "0" data states. Also as illustrated, source 165B has not been connected to Vsvb 185 through contact window 175B (no fabricated via), and source 165C has not been connected to Vsvb 185 through contact window 175C (no fabricated via), thereby programming the corresponding transistors 170B and 170C, of the corresponding ROM cells 150B and 150C, to "1" data states. As in other types of ROMs, this programming of contact windows 175 occurs in the mask preparation stage of IC fabrication, such that a connection (via) is or is not made during IC fabrication for any selected ROM cell 150 of the ROM array 100, 200.

Also in each ROM cell 150, each drain 160 is coupled to a column 110. As illustrated, the drains 160 of pair-wise adjacent ROM cells 150 for a given column 110 have a shared and fixed (i.e., non-programmable) drain-to-column connection 180, illustrated as shared drain-column connections or couplings 180AC and 180BD. Because the drains 160 of adjacent transistors 170 may use a shared connection 180 to a column 110, the number of vertical, tubular conductive drain-column connections is reduced by one-half, with a corresponding reduction in capacitance and capacitive coupling.

In the illustrated example of FIG. 2, there is one fixed column contact for the drains 160, of transistors 170, of every two adjacent cells 150 on the column (i.e., the drains 160 of two adjacent transistors, 170A and 170C or 170B and 170D, are directly coupled to the corresponding column 110 using the fixed column contacts 180AC and 180BD, respectively). This configuration guarantees a fixed contact window-related and diffusion capacitance per column, regardless of the stored data states of the cells on the column, namely, regardless of the number of "1's" or "0's" stored by the cells 150 on the column 110. This fixed contact window and diffusion capacitance is 50% of the maximum that could occur in a prior art memory array which could have all the cell transistor drains connected to their corresponding columns, each having their own separate contact window and diffusion.

The reduced and fixed number of column contacts yields, in comparison to prior art ROM arrays: (1) a reduction by one-half, for "fully programmed" columns (i.e., all cells programmed to "0" data states), of column-to-column coupling due to a victim column's drain contact window coupling to an aggressor column; (2) a column cell drain diffusion capacitance that is one-half of that for a fully programmed column; and (3) a fixed capacitance of all columns that is not a function of the number of cells programmed to "0" or "1" data states. Such reduction of undesirable capacitive coupling results in an associated reduction in the occurrence of memory read faults due to column-to-column coupling, makes memory read faults independent of cell programmed data type, and decreases read access time. In addition, utilization of one fixed column contact for the drains of every two adjacent transistors 170 on the column further simplifies the manufacturing of ROM arrays of the present invention.

Figure 3:
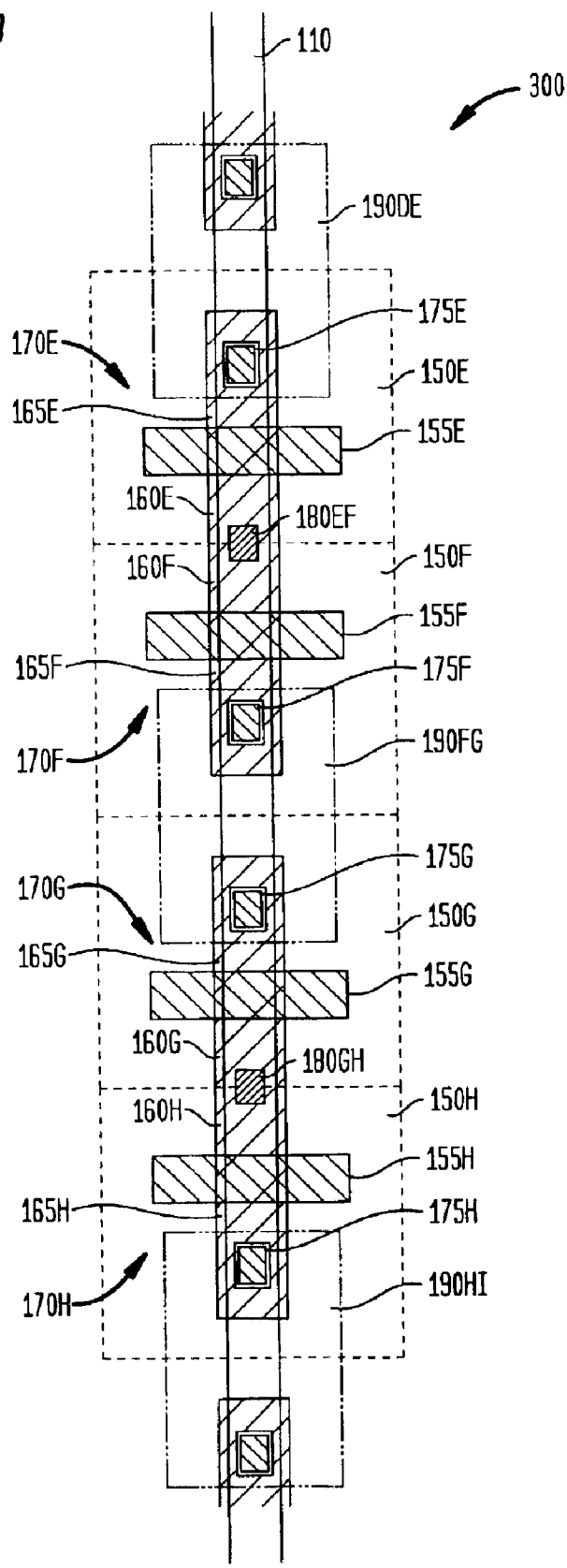
FIG. 3 (or FIG. 3) is a topological view of a portion of a ROM memory cell array in accordance with the teachings of the invention.

FIG. 3 is a topological view of a portion of a ROM memory cell array 300, illustrated as a plurality of superimposed, fabricated layers, for a ROM array in accordance with the teachings of the invention. Four ROM cells 150 are illustrated for a selected column 110, namely, ROM cell 150E, ROM cell 150F, ROM cell 150G, and ROM cell 150H. The column 110 is generally fabricated in a metal 2 layer, above the various transistors 170 in an array 300. The drains 160E and 160F of adjacent transistors 170E and 170F are fabricated as a single, common (or merged) first diffusion region and share a common and fixed connection 180EF to the selected column 110, and the drains 160G and 160H of adjacent transistors 170G and 170H also are fabricated as a single, common (or merged) second diffusion region and share a common and fixed connection 180GH to the selected column 110. The drain contacts 180 are drain diffusion to metal 2 column contacts. The sources 165 are diffusion regions, the gates 155 are polysilicon, and the programmable source contacts 175 are source diffusion to metal 1 (source voltage bus or ground) contacts. (In the event that rows (not separately illustrated) are to be implemented in a metal 1 layer (rather than metal 3), then the programmable source contacts 175 are source diffusion to metal 3 (source voltage bus or ground) contacts.) It should be noted that in the exemplary layout of FIG. 3, for each of these adjacent transistor 170 pairings, the second transistor 170 of the pair is inverted (e.g., a mirror image) of the first transistor of the pair. It also should be noted that a drain diffusion to metal 2 contact is typically fabricated as series of two contacts, a drain to metal 1 contact in series with a metal 1 to metal 2 contact. Lastly, it should be noted that any of various, alternative metal layer (1, 2, or 3) assignments may be made equivalently and are also within the scope of the present invention.

In contrast, the sources 165, namely, source 165E, source 165F, source 165G, and source 165H each have a corresponding, programmable contact window (175E, 175F, 175G and 175H) to selectively provide or not provide a contact (selective coupling) to the source voltage bus (not separately illustrated), which is at a second predetermined voltage level (such as ground) of the IC, through a metal layer 190 (190DE, 190FG, and 190HI), such as metal 1 to Vsvb.

In summary, the present invention provides a read-only memory comprising: (1) a first column 110, as a bit selection line, pre-charged to a first predetermined voltage level; (2) a first row 120, as a word selection line; and (3) a first transistor 170 having a first gate 155 coupled to the first row 120, having a first drain 160 coupled to the first column 110, and further having a first source 165 selectively couplable through a first programmable contact 175 to a source voltage bus 185 having a (second) predetermined voltage level, Vsvb. The selective coupling of the first source to the source voltage bus is predetermined during fabrication of the read-only memory. A second transistor having a second drain may also be coupled to the first column with the first drain of the first transistor through a shared, fixed contact. In one example, when the read-only memory is operative, the first column 110 is pre-charged to a first predetermined voltage level ($V_{PC}$), and the source voltage bus 185 is at a second, generally lower, predetermined voltage level, such as substantially at a ground potential.

When the ROM is operative (i.e., powered on and functioning) and when the first source is coupled to the source voltage bus by the first programmable contact, the read-only memory is programmed for a first data state, and when the first gate is activated, the first transistor is capable of conducting to discharge (or move) the first column (voltage) to the second predetermined voltage level. When the first source is not coupled to the source voltage bus by the first programmable contact, the read-only memory is programmed for a second data state, and when the first gate is activated, the first transistor is not capable of conducting and the first column remains substantially at the first predetermined voltage level, namely, the pre-charged voltage level $V_{PC}$. A sense amplifier coupled to the first column is capable of sensing the first and second data states, generally as corresponding voltage levels, on the first column when the first gate is activated.

Also in summary, in accordance with the present invention, a read-only memory array comprises: a plurality of columns 110 forming at least one read bus (i.e., one or more read buses); a plurality of rows 120 forming at least one word selection bus; a first plurality of transistors 170 corresponding to or representing a first plurality of information bits having a first data state, for a first combination of the plurality of columns and plurality of rows; and a second plurality of transistors 170 corresponding to or representing a second plurality of information bits having a second data state, for a second combination of the plurality of columns and plurality of rows. Each transistor of the first plurality of transistors has a corresponding drain 160 coupled to a selected column of the plurality of columns, has a gate 155 coupled to a selected row of the plurality of rows, and has a source 165 coupled (via connection 175) to the source voltage bus 185. Each transistor of the second plurality of transistors has a corresponding drain 160 coupled to a selected column of the plurality of columns, has a gate 155 coupled to a selected row of the plurality of rows, and has a source 165 not coupled to (or otherwise electrically isolated from) the source voltage bus 185.

In selected embodiments, for a selected column of the plurality of columns, corresponding drains of adjacent and paired transistors of the plurality of transistors are coupled to the selected column through a shared, fixed contact. A sense amplifier is also coupled to the plurality of columns, and when the read-only memory array is operative, the source voltage bus is at a second predetermined voltage level (such as a ground potential) and the column is pre-charged to a first predetermined voltage level (such as a selected non-ground voltage level); when a transistor of the first plurality of transistors is activated, the sense amplifier is capable of detecting the first data state as a first voltage level substantially equal to second predetermined voltage level, and when a transistor of the second plurality of transistors is activated, the sense amplifier is capable of detecting the second data state as a second voltage level substantially equal to the first predetermined voltage level.

Figure 4:
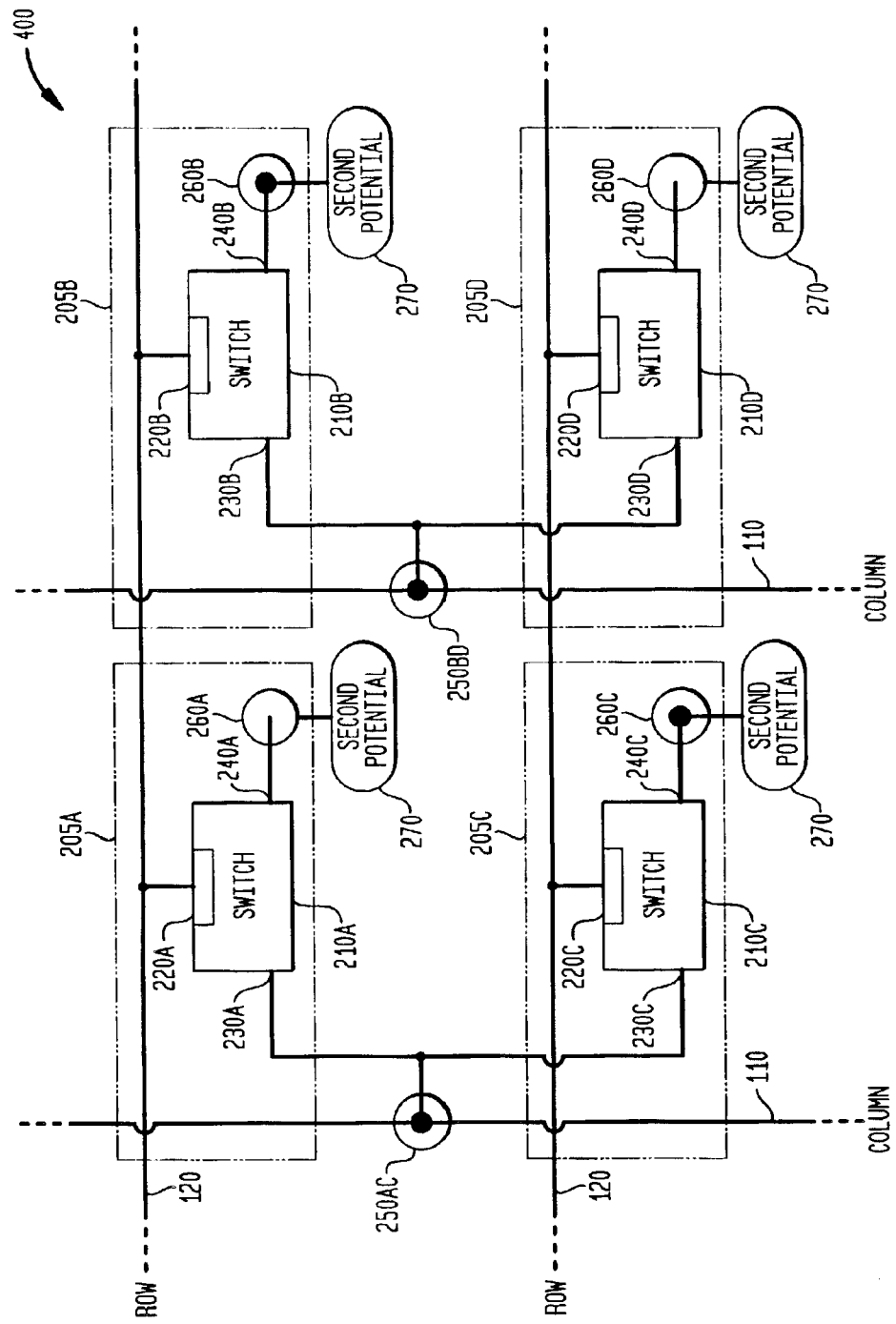
FIG. 4 (or FIG. 4) is a circuit and block diagram of a second exemplary ROM memory cell array in accordance with the teachings of the invention.

FIG. 4 (or FIG. 4) is a circuit and block diagram of a portion of a second exemplary ROM memory cell array 400 in accordance with the teachings of the invention. The second exemplary ROM memory cell array 400 includes a plurality of columns 110 adapted to be driven to a first potential (e.g., $V_{PC}$), such as by being pre-charged to the first potential when the IC is operative (powered on and functioning); a plurality of rows 120; and a plurality of switches (or switch devices) 210 controlled by the corresponding row 120 through a control terminal 220 and selectively providing a current path (or electrical connection) from the corresponding column 110 on a first side (or first terminal) 230 of the switch 210 to a second potential 270 (e.g., Vsvb) on a second side (or second terminal) of the switch 240, with the second potential 270 different than the first potential, and with the current path (or electrical connection) capable of being completed or not completed through a programmable connection 260 on the second side 240 of the switch 210. The second potential may be lower than the first potential, may be a ground potential, or may be higher than the first potential. The capability of the current path (or electrical connection) being completed or not completed through the programmable connection 260 is predetermined during fabrication of the ROM memory cell array 400.

The switch 210 may be a transistor, as illustrated in FIGS. 1, 2 and 3, with a first terminal (e.g., 230 or 160) coupled to the column, a second terminal (e.g., 240 or 165) selectively coupled to the second potential 270 (e.g., Vsvb) through a programmable connection (260 or 175), and a third or control terminal (e.g., 220 or 155) coupled to the row. When the transistor is a metal oxide semiconductor transistor, the first terminal is a drain, the second terminal is a source, and the third terminal is a gate. When the transistor is a bipolar junction transistor, the first terminal is a collector, the second terminal is an emitter, and the third terminal is a base.

As illustrated in FIG. 4, the portion of the ROM memory cell array 400 includes four memory cells 205, illustrated as ROM cell 205A, ROM cell 205B, ROM cell 205C, and ROM cell 205D, each of which is correspondingly comprised of a switch 210, namely, switch 210A, switch 210B, switch 210C, and switch 210D. The array 400 is defined by the plurality of columns 110 and rows 120, with their corresponding ROM cells 205. As will be appreciated by those of ordinary skill in the art, the ROM memory cell array 400 may include any number of ROM memory cells 205 per column, for example 256 or 512 memory cells per column, and/or any number of rows and columns.

In each ROM cell 205, a control terminal 220 of the switch 210 is coupled to a row 120, and each second side 240 is selectively (i.e., programmably) coupled to the second potential 270 (a second predetermined voltage level), through a corresponding programmable contact window 260. When a row 120 is selected, each switch 210 of the row 120 is activated, via control terminal 220 and, when the programmable contact window 260 is programmed as a completed electrical connection, will provide a conductive current path between the corresponding column 110 and second potential 270. For purposes of explanation, the ROM array 400 in FIG. 4 is also illustrated in a fabricated or programmed state, with the programmable contact windows 260 either having an actual contact connecting a second side 240 to the second potential 270 (also illustrated in FIG. 4 as a "thick connection dot") to complete an electrical connection (or current path, equivalently) between the second side 240 and second potential 270, or having no actual contact connecting a second side 240 to the second potential 270, i.e., no completed electrical connection (no completed current path or equivalently, illustrating electrical isolation) between the second side 240 and second potential 270 (also illustrated in FIG. 4 without any "thick connection dot").

As illustrated, second side (or second terminal) 240A has not been connected to second potential 270 through contact window 260A, and second side (or second terminal) 240D has not been connected to second potential 270 through contact window 260D, thereby programming the corresponding switches 210A and 210D, of the corresponding ROM cells 205A and 205D, to "1" data states. Also as illustrated, second side (or second terminal) 240B has been connected to second potential 270 through contact window 260B, and second side (or second terminal) 240C has been connected to second potential 270 through contact window 260C, thereby programming the corresponding switches 210B and 210C, of the corresponding ROM cells 205B and 205C, to "0" data states. As in other types of ROMs, this programming of contact windows 260 occurs in the mask preparation stage of IC fabrication, such that a connection is or is not made during IC fabrication for any selected ROM cell 205 of the ROM array 400.

Also in each ROM cell 205, each first side 230 of each switch 210 is coupled to a column 110. As illustrated, the first sides 230 of pair-wise adjacent switches 210 for a given column 110 have a shared and fixed (i.e., non-programmable) first side-to-column connection 250, illustrated as shared column connections or couplings 250AC and 250BD. Because the first sides 230 of adjacent switches 210 may use a shared connection 250 to a column 110, the number of vertical, tubular conductive connections is reduced by one-half, with a corresponding reduction in capacitance and capacitive coupling, as previously discussed.

Figure 5:
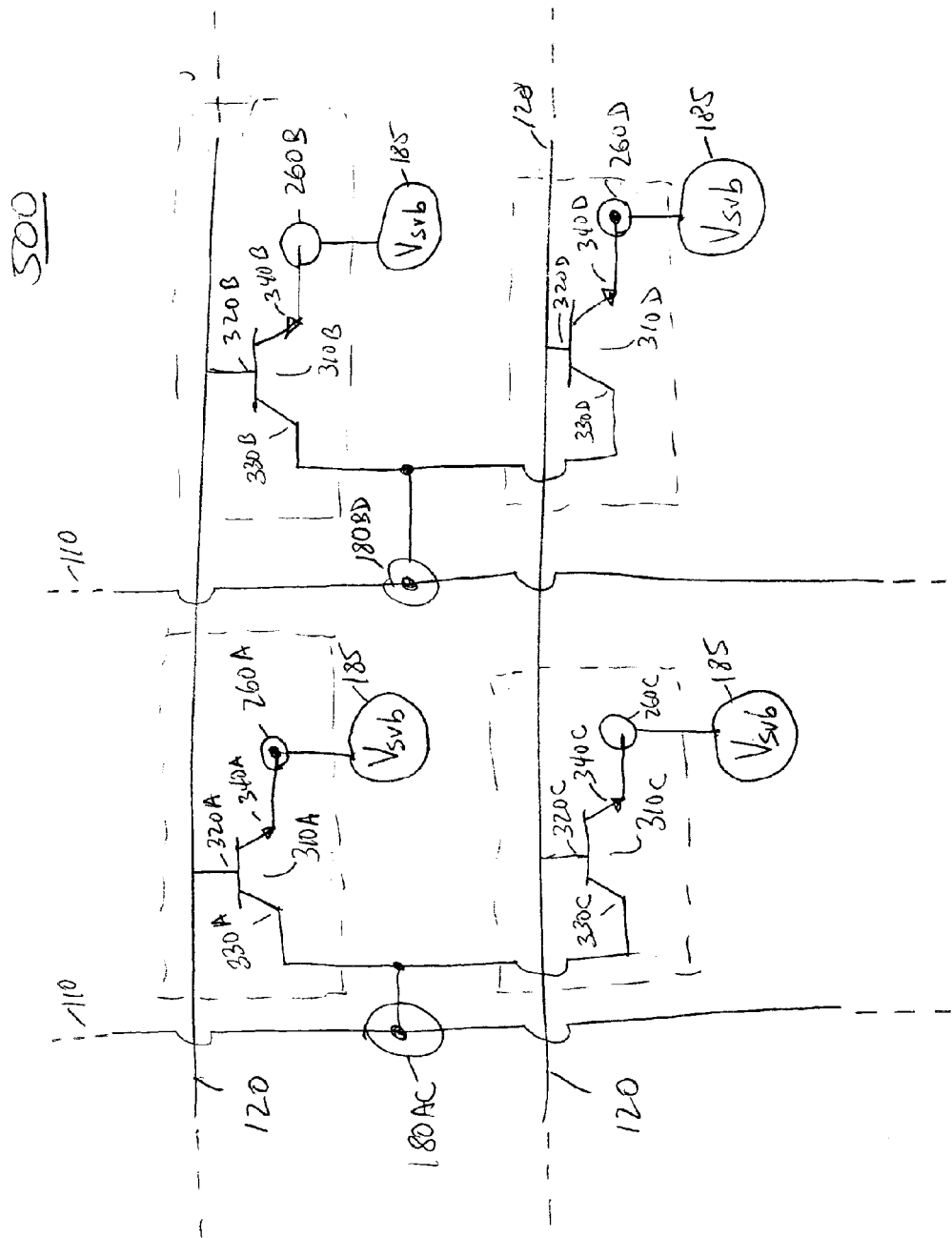
FIG. 5 (or FIG. 5) is a circuit diagram of a third exemplary ROM memory cell array in accordance with the teachings of the invention.

FIG. 5 (or FIG. 5) is a circuit diagram of a third exemplary ROM memory cell array 500 in accordance with the teachings of the invention, and illustrates the memory array of the present invention embodied using bipolar junction transistors 310 (illustrated as bipolar junction transistors 310A–310D). As previously discussed with respect to FIG. 4, when a switch 210 is implemented or embodied using a bipolar junction transistor 310, the first terminal coupled to the column 110 is a collector 330, the second terminal selectively coupled to the second potential (e.g.. Vsvb 185) through a programmable connection 260 is an emitter 340, and the third or control terminal coupled to the row 120 is a base 320.

In summary, the read-only memory array 400 includes: a plurality of columns 110 forming at least one read bus, at least one column of the plurality of columns capable of being pre-charged to a first predetermined voltage level (e.g., $V_{PC}$); a plurality of rows 120 forming at least one word selection bus; a first plurality of switches 210, a selected switch 210 of the first plurality of switches controlled by a first row of the plurality of rows, the selected switch 210 of the first plurality of switches having a first terminal 230 coupled to a first column 110 of the plurality of columns and having a second terminal 240 coupled to a second potential 270 or voltage bus (e.g., source voltage bus having potential Vsvb), the selected switch 210 of the first plurality of switches capable of providing an electrical connection from the first column to the voltage bus (second potential 270) in response to activation by the first row, the voltage bus capable of having a second predetermined voltage level; and a second plurality of switches 210, a selected switch 210 of the second plurality of switches controlled by a second row 120 of the plurality of rows, the selected switch 210 of the second plurality of switches having a first terminal 230 coupled to a second column 110 of the plurality of columns and having a second terminal 240 electrically isolated from or otherwise not electrically coupled to the second potential 270 (or voltage bus), the selected switch 210 of the second plurality of switches incapable of providing an electrical connection from the second column 110 to the voltage bus (or second potential 270) in response to activation by the second row. As a consequence, the first plurality of switches 210 are capable of storing a first plurality of information bits having a first data state, and the second plurality of switches 210 are capable of storing a second plurality of information bits having a second data state.

The present invention also includes a method of fabricating a cell 150 or 205 for a read-only memory of an integrated circuit. The method includes providing a column 110; providing a row 120; providing a switch device (e.g., 210, 170) controlled by the row 120 (e.g., through a base, gate 155 or other control terminal 220); providing an electrical connection 180, 250 between the column 110 and a first side 230 of the switch device 210 (e.g., 160); for a first data state, providing an electrical connection 175, 260 between a second side 240 of the switch device 210 (e.g., 165) and a voltage bus (e.g., source voltage bus 185 having potential Vsvb or second potential 270); and for a second data state, not providing an electrical connection 175, 260 between the second side 240 of the switch device 210 and the voltage bus (or second potential 270). The step of providing or not providing an electrical connection 175, 260 between the second side 240 of the switch device 210 and the voltage bus (or second potential 270) generally comprises determining a corresponding state of a programmable contact window 175 or 260 between the second side 240 of the switch device 210 and the voltage bus (or second potential 270).

The step of providing a switch device 210 may comprise fabricating a transistor 170, such as fabricating a metal oxide semiconductor transistor having: a drain coupled to the column; a gate coupled to the row; for the first data state, having a source coupled to the voltage bus through a programmable contact window, and for the second data state, having a source not coupled to the voltage bus through the programmable contact window. Alternatively, the step of fabricating a transistor may comprise fabricating a bipolar junction transistor having: a collector coupled to the column; a base coupled to the row; for the first data state, having an emitter coupled to the voltage bus through a programmable contact window, and for the second data state, having an emitter not coupled to the voltage bus through the programmable contact window.

Numerous advantages of the present invention are readily apparent. The ROM architecture of the present invention provides for increased ROM cell density, while simultaneously preventing read faults due to capacitive coupling. The ROM architecture disclosed herein significantly reduces column-to-column capacitive coupling; significantly reduces column cell drain diffusion capacitance; and provides a fixed capacitance for all columns that is not a function of the stored data, such as whether a particular cell is programmed to be a logical low or high. Such reduction of undesirable capacitive coupling results in an associated reduction in the occurrence of memory read faults due to column-to-column coupling, makes memory read faults independent of cell programmed data type, and decreases read access time.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A read-only memory comprising:
   a column;
   a first row; and
   a first transistor having a first gate coupled to the first row, having a first drain coupled to the column, and further having a first source selectively couplable through a first programmable contact to a source voltage bus;
   wherein when the read-only memory is operative, the column is pre-charged substantially to a first predetermined voltage level and the source voltage bus is substantially at a second predetermined voltage level.

2. The read-only memory of claim 1, wherein when the first source is coupled to the source voltage bus by the first programmable contact and when the first gate is activated, the first transistor is capable of conducting to move the column substantially to the second predetermined voltage level.

3. The read-only memory of claim 1, wherein when the first source is not coupled to the source voltage bus by the first programmable contact and when the first gate is activated, the first transistor is not capable of conducting and the column remains substantially at the first predetermined voltage level.

4. The read-only memory of claim 1, wherein the second predetermined voltage level is substantially a ground potential.

5. The read-only memory of claim 4, wherein a substrate of the first transistor is substantially at a ground potential.

6. The read-only memory of claim 1, wherein the first row is a word selection line.

7. The read-only memory of claim 1, wherein the column is a bit selection line.

8. The read-only memory of claim 1, wherein when the first source is coupled to the source voltage bus by the first programmable contact, the read-only memory is programmed for a first state.

9. The read-only memory of claim 8, further comprising:
   a sense amplifier coupled to the column to sense the first state on the column when the first gate is activated.

10. The read-only memory of claim 1, wherein when the first source is not coupled to the source voltage bus by the first programmable contact, the read-only memory is programmed for a second state.

11. The read-only memory of claim 10, further comprising:
    a sense amplifier coupled to the column to sense the second state on the column when the first gate is activated.

12. The read-only memory of claim 1, further comprising:
    a second row; and
    a second transistor having a second gate coupled to the second row, having a second drain coupled to the column, and further having a second source selectively couplable through a second programmable contact to the source voltage bus.

13. The read-only memory of claim 12, wherein the first drain and the second drain are coupled to the column through a shared, fixed contact.

14. The read-only memory of claim 12, wherein the selective coupling of the first source to the source voltage bus and the selective coupling of the second source to the source voltage bus are predetermined during fabrication of the read-only memory.

15. The read-only memory of claim 1, wherein the read-only memory is embodied as an integrated circuit including a processor.

16. An integrated circuit including a read-only memory, the integrated circuit comprising:
    a column adapted to be driven to a first potential;
    a row; and
    a switch device controlled by the row and providing a current path from the column on a first side of the switch device to a second potential on a second side of the switch device, the second potential different than the first potential, the current path capable of being completed or not completed through a first programmable connection on the second side of the switch device;
    wherein the capability of the current path being completed or not completed through the first programmable connection is predetermined during fabrication of the integrated circuit.

17. An integrated circuit as recited in claim 16, wherein the second potential is lower than the first potential.

18. An integrated circuit as recited in claim 17, wherein the second potential is a ground potential.

19. An integrated circuit as recited in claim 16, wherein the second potential is higher than the first potential.

20. An integrated circuit as recited in claim 16, wherein the switch device is a transistor.

21. An integrated circuit as recited in claim 20, wherein the transistor has a first terminal coupled to the column, a second terminal selectively coupled to the second potential through the first programmable connection, and a third terminal coupled to the row.

22. An integrated circuit as recited in claim 21, wherein the transistor is a metal oxide semiconductor transistor.

23. An integrated circuit as recited in claim 22, wherein the first terminal is a drain, the second terminal is a source, and the third terminal is a gate.

24. An integrated circuit as recited in claim 21, wherein the transistor is a bipolar junction transistor.

25. An integrated circuit as recited in claim 24, wherein the first terminal is a collector, the second terminal is an emitter, and the third terminal is a base.

26. An integrated circuit as recited in claim 16, wherein the integrated circuit is a processor.

27. An integrated circuit including a read-only memory, the integrated circuit comprising:
a column;
a row; and
a switch device controlled by the row and providing an electrical connection from the column on a first side of the switch device to a predetermined potential on a second side of the switch device, the electrical connection capable of being completed or not completed through a programmable connection on the second side of the switch device;
wherein the capability of the current path being completed or not completed through the first programmable connection is predetermined during fabrication of the integrated circuit.

28. An integrated circuit as recited in claim 27, wherein the predetermined potential is a ground potential.

29. An integrated circuit as recited in claim 27, wherein the switch device is a metal oxide semiconductor transistor having a drain coupled to the column, a source selectively coupled to the predetermined potential through the programmable connection, and a gate coupled to the row.

30. An integrated circuit as recited in claim 27, wherein the switch device is a bipolar junction transistor having a collector coupled to the column, an emitter selectively coupled to the predetermined potential through the programmable connection, and a base coupled to the row.

31. A read-only memory array, the read-only memory array comprising:
a plurality of columns, at least one column of the plurality of columns capable of being pre-charged to a first predetermined voltage level;
a plurality of rows;
a first plurality of switches, a selected switch of the first plurality of switches controlled by a first row of the plurality of rows, the selected switch of the first plurality of switches having a first terminal coupled to a first column of the plurality of columns and having a second terminal coupled to a voltage bus, the selected switch of the first plurality of switches capable of providing an electrical connection from the first column to the voltage bus in response to activation by the first row, the voltage bus capable of having a second predetermined voltage level; and
a second plurality of switches, a selected switch of the second plurality of switches controlled by a second row of the plurality of rows, the selected switch of the second plurality of switches having a first terminal coupled to a second column of the plurality of columns and having a second terminal electrically isolated from the voltage bus, the selected switch of the second plurality of switches incapable of providing an electrical connection from the second column to the voltage bus in response to activation by the second row.

32. The read-only memory array of claim 31, wherein the first plurality of switches are capable of storing a first plurality of information bits having a first data state, and the second plurality of switches are capable of storing a second plurality of information bits having a second data state.

33. The read-only memory array of claim 32, further comprising:
a sense amplifier coupled to the plurality of columns, the sense amplifier capable of sensing the first data state and the second data state.

34. The read-only memory array of claim 31, wherein when the read-only memory array is operative, the second predetermined voltage level of the voltage bus is substantially a ground potential, and the plurality of columns are pre-charged to a selected voltage level greater than ground potential.

35. The read-only memory array of claim 31, wherein when the read-only memory array is operative, the second predetermined voltage level of the voltage bus is a first selected voltage level, and the plurality of columns are pre-charged to a second selected voltage level, the first selected voltage level greater than the second selected voltage level.

36. The read-only of claim 31, wherein the first plurality of switches and the second plurality of switches further comprise a plurality of metal oxide semiconductor transistors.

37. The read-only memory array of claim 31, wherein the first plurality of switches and the second plurality of switches further comprise a plurality of bipolar junction transistors.

38. A read-only memory array comprising:
a plurality of columns;
a plurality of rows;
a first plurality of transistors, at least one transistor of the first plurality of transistors having a drain coupled to a selected column of the plurality of columns, having a gate coupled to a selected row of the plurality of rows, and further having a source coupled to a source voltage bus; and
a second plurality of transistors, at least one transistor of the second plurality of transistors having a drain coupled to a selected column of the plurality of columns, having a gate coupled to a selected row of the plurality of rows, and further having a source not coupled to the source voltage bus.

39. The read-only memory array of claim 38, wherein for a selected column of the plurality of columns, corresponding drains of adjacent and paired transistors of the first plurality of transistors and second plurality of transistors are coupled to the selected column through a shared, fixed contact.

40. The read-only memory array of claim 38, wherein the first plurality of transistors correspond to a first plurality of information bits having a first data state, and the second plurality of transistors correspond to a second plurality of information bits having a second data state.

41. The read-only memory array of claim 40, further comprising:
a sense amplifier coupled to the plurality of columns, the sense amplifier capable of sensing the first data state and the second data state.

42. The read-only memory array of claim 41, wherein when the read-only memory array is coupled to a power supply and is operative, the source voltage bus is at a ground potential and the plurality of columns are pre-charged to a selected voltage level.

43. The read-only memory array of claim 42, wherein the sense amplifier is capable of detecting the first data state as a first voltage level substantially equal to ground potential, and wherein the sense amplifier is capable of detecting the second data state as a second voltage level substantially equal to the selected voltage level.

44. An integrated circuit including a read-only memory, the integrated circuit comprising:
a plurality of columns;
a plurality of rows;
at least one transistor having a drain coupled to a selected column of the plurality of columns, a gate coupled to a selected row of the plurality of rows, and a source coupled to a predetermined potential; and
at least one transistor having a drain coupled to a selected column of the plurality of columns, a gate coupled to a selected row of the plurality of rows, and a source not coupled to the predetermined potential.

45. An integrated circuit as recited in claim 44, wherein the predetermined potential is ground potential.

46. An integrated circuit as recited in claim 44, wherein the predetermined potential is a substrate potential.

47. An integrated circuit including a read-only memory, the integrated circuit comprising:
a plurality of columns;
a plurality of rows;
at least one transistor having a collector coupled to a selected column of the plurality of columns, a base coupled to a selected row of the plurality of rows, and an emitter coupled to a predetermined potential; and
at least one transistor having a collector coupled to a selected column of the plurality of columns, a base coupled to a selected row of the plurality of rows, and an emitter not coupled to the predetermined potential.

48. An integrated circuit as recited in claim 47, wherein the predetermined potential is ground potential.

49. A read-only memory array comprising:
a column;
a plurality of rows;
a first transistor having a first gate coupled to a first row of the plurality of rows, having a first drain coupled to the column, and the first transistor further having a first source coupled to a source voltage bus; and
a second transistor having a second gate coupled to a second row of the plurality of rows, having a second drain coupled to the column, and further having a second source not coupled to the source voltage bus;
wherein when the read-only memory is operative, the column is pre-charged substantially to a first predetermined voltage level and the source voltage bus is substantially at a second predetermined voltage level.

50. The read-only memory array of claim 49, the first drain of the first transistor and the second drain of the second transistor are coupled to the column through a shared contact.

51. The read-only memory array of claim 49, wherein the first transistor is capable of storing a first information bit having a first data state, and wherein the second transistor is capable of storing a second information bit having a second data state.

52. The read-only memory array of claim 51, further comprising:
a sense amplifier coupled to the column, the sense amplifier capable of sensing the first data state and the second data state.

53. The read-only memory array of claim 52, wherein when the read-only memory array is operative, the column is pre-charged to a first predetermined voltage level and the source voltage bus is at a second predetermined voltage level; wherein when the first transistor is activated, the sense amplifier is capable of detecting the first data state as a first voltage level substantially equal to the second predetermined voltage level, and when the second transistor is activated, the sense amplifier is capable of detecting the second data state as a second voltage level substantially equal to the first predetermined voltage level.

54. A read-only memory array comprising:
a plurality of columns;
a plurality of rows;
a first transistor of a plurality of transistors, the first transistor having a first gate coupled to a first row of the plurality of rows, having a first drain coupled through a first contact to a first column of the plurality of columns, and the first transistor further having a first source coupled to a source voltage bus; and
a second transistor of the plurality of transistors having a second gate coupled to a second row of the plurality of rows, having a second drain coupled through the first contact to the first column, and further having a second source not coupled to the source voltage bus.

55. A read-only memory array comprising:
a plurality of columns;
a plurality of rows;
a first plurality of transistors for storing a first plurality of information bits in a first data state, each transistor of the first plurality of transistors having a corresponding drain coupled to a selected column of the plurality of columns, having a gate coupled to a selected row of the plurality of rows, and further having a source coupled to a source voltage bus; and
a second plurality of transistors for storing a second plurality of information bits in a second data state, each transistor of the second plurality of transistors having a corresponding drain coupled to a selected column of the plurality of columns, having a gate coupled to a selected row of the plurality of rows, and further having a source not coupled to the source voltage bus;
a sense amplifier coupled to the plurality of columns, the sense amplifier capable of sensing the first data state as a first predetermined voltage level and the second data state as a second predetermined voltage level.

56. A method of fabricating a cell for a read-only memory of an integrated circuit, the method comprising:
providing a column;
providing a row;
providing a switch device controlled by the row;

providing an electrical connection between the column and a first side of the switch device;

for a first data state, providing an electrical connection between a second side of the switch device and a voltage bus by determining a corresponding first state of a programmable contact window between the second side of the switch device and the voltage bus; and for a second data state, not providing an electrical connection between the second side of the switch device and the voltage bus by determining a corresponding second state of a programmable contact window between the second side of the switch device and the voltage bus.

57. A method of fabricating an integrated circuit as recited in claim 56, wherein the step of providing a switch device comprises fabricating a transistor.

58. A method of fabricating an integrated circuit as recited in claim 56, wherein the step of fabricating a transistor comprises fabricating a metal oxide semiconductor transistor having: a drain coupled to the column; a gate coupled to the row; for the first data state, having a source coupled to the voltage bus through a programmable contact window, and for the second data state, having a source not coupled to the voltage bus through the programmable contact window.

59. A method of fabricating an integrated circuit as recited in claim 56, wherein the step of fabricating a transistor comprises fabricating a bipolar junction transistor having: a collector coupled to the column; a base coupled to the row; for the first data state, having an emitter coupled to the voltage bus through a programmable contact window, and for the second data state, having an emitter not coupled to the voltage bus through the programmable contact window.

60. A read-only memory comprising:

a column;

a first row;

a second row;

a first transistor having a first gate coupled to the first row and having a first drain;

a second transistor having a second gate coupled to the second row and having a second drain; and a drain-to-column contact coupling both the first drain and the second drain to the column.

61. The read-only memory of claim 60, wherein the first transistor has a first source selectively couplable through a first programmable contact to a source voltage bus and wherein the second transistor has a second source selectively couplable through a second programmable contact to the source voltage bus.

62. The read-only memory of claim 60, wherein the first transistor has a first source coupled through a first programmable contact to a source voltage bus for a first data state and wherein the second transistor has a second source not coupled through a second programmable contact to the source voltage bus for a second data state.

63. The read-only memory of claim 60, wherein the first transistor has a first source coupled through a first programmable contact to a source voltage bus for a first data state and wherein the second transistor has a second source electrically isolated from the source voltage bus for a second data state.

64. A read-only memory comprising:

a column;

a first row;

a second row;

a first transistor having a first gate coupled to the first row and having a first drain;

a second transistor having a second gate coupled to the second row and having a second drain, the second drain forming a common diffusion region with the first drain; and a drain-to-column contact coupling the common diffusion region to the column.

65. The read-only memory of claim 64, wherein the first transistor has a first source selectively couplable through a first programmable contact to a source voltage bus and wherein the second transistor has a second source selectively couplable through a second programmable contact to the source voltage bus.

66. The read-only memory of claim 64, wherein the first transistor has a first source coupled through a first programmable contact to a source voltage bus for a first data state and wherein the second transistor has a second source not coupled through a second programmable contact to the source voltage bus for a second data state.

67. The read-only memory of claim 64, wherein the first transistor has a first source coupled through a first programmable contact to a source voltage bus for a first data state and wherein the second transistor has a second source electrically isolated from the source voltage bus for a second data state.

* * * * *